United States Patent
Maliakal et al.

(10) Patent No.: US 8,008,116 B2
(45) Date of Patent: Aug. 30, 2011

(54) BRANCHED PHENYLENE-TERMINATED THIOPHENE OLIGOMERS

(75) Inventors: Ashok J. Maliakal, Westfield, NJ (US); Ming L. Tang, Stanford, CA (US)

(73) Assignee: Alcatel Lucent, Paris (FR)

( * ) Notice: Subject to any disclaimer, the term of this patent is extended or adjusted under 35 U.S.C. 154(b) by 24 days.

(21) Appl. No.: 12/700,821

(22) Filed: Feb. 5, 2010

(65) Prior Publication Data

US 2010/0136741 A1 Jun. 3, 2010

Related U.S. Application Data

(62) Division of application No. 11/257,902, filed on Oct. 25, 2005, now Pat. No. 7,714,320.

(51) Int. Cl.
*H01L 51/40* (2006.01)

(52) U.S. Cl. .......................... 438/99; 257/40

(58) Field of Classification Search .............. 257/40; 438/99

See application file for complete search history.

(56) References Cited

U.S. PATENT DOCUMENTS

| | | | |
|---|---|---|---|
| 5,331,029 A | 7/1994 | Sato et al. | |
| 2005/0089777 A1 | 4/2005 | Ang et al. | |
| 2005/0274954 A1 | 12/2005 | Tanaka et al. | |
| 2006/0009614 A1 | 1/2006 | Yamahara et al. | |
| 2006/0102890 A1 | 5/2006 | Yamahara et al. | |
| 2006/0122364 A1 | 6/2006 | Obara et al. | |
| 2007/0092752 A1 | 4/2007 | Maliakal et al. | |

FOREIGN PATENT DOCUMENTS

WO 2004009680 A2 1/2004

OTHER PUBLICATIONS

Facchetti, Antonio, et al.,; "Synthesis and Characterization of Diperfluorooctyl-Substituted Phenylene-Thiophene Oligomers as n-type Semiconductors, Molecular Structure"; Chemistry of Materials 16 (2004); pp. 4715-4727.

Donat, B. Pepin, et al.; "Increased field effect mobility from linear to branched thiophene-based polymers", Synthetic Metals 146 (2004), pp. 225-231.

Ponomarenko, Sergei A., et al.; "1, 4-bis(5-decyl-2,2'-bithien-5-yl)benzene as new stable organic semiconductor for high performance thin film transistors"; Synthetic Metals 149 (2005); pp. 231-235.

Ohishi, Hitoshi, et al.; Amorphous Molecular Materials with High Carrier Mobilities: Thiophene- and Selenophene-Containing Tris(oligoarylenyl)amines; Chemistry Letters, vol. 33, No. 10 (2004); pp. 1266.

Kinoshita, Motoi, et al.; "1,3-Bis[5-(dimesitylboryl)thiopen-s-yl]benzene and 1,3,5-Tris[5-(dimesityl-boryl) thiophen-2-yl]benzene as a Novel Family of Electron-Transporting Hole Blockers for Organic Electroluminescent devices"; Chemistry Letters 2001; pp. 614.

Mushrush, Melissa, et al.; Easily Processable Phenylene-Thiophene-Based Organic Filed-Effect Transistors and Solution-Fabricated Nonvolatile Transistor Memory Elements; J. Am. Chem. Soc. 2003, 125, pp. 9414-9423.

(Continued)

*Primary Examiner* — Ken A Parker
*Assistant Examiner* — Anthony Ho
(74) *Attorney, Agent, or Firm* — Hitt Gaines, PC

(57) ABSTRACT

A composition comprising a plurality of molecules. Each of the molecules has a core comprising at least one aromatic ring and at least three pendant arms chemically bonded to the core. The pendant arms comprise a phenylene-terminated thiophene oligomer.

5 Claims, 3 Drawing Sheets

OTHER PUBLICATIONS

Ando, Shinji, et al.; "High Performance n-Type Organic Field-Effect transistors Based on π-Electronic Systems with Trifluoromethylphenyl Groups"; J. Am. Chem. Society 2005, 127; 5336-5337.

Anthony, John E, et al.; "Functionalized Pentacene: Improved Electronic Properties from Control of Solid-State Order"; J. Am. Chem. Society 2001, 123; pp. 9482-9483.

Pei, Jian, et al.; "Star-Shaped Polycyclic Aromatics Based on Oligothiophene-Functionalized Truxene: Synthesis, Properties, and Facile Emissive Wavelength Tuning"; J. Am. Chem. Soc. 2003, 125; pp. 9944-9945.

Laquindanum, Joyce G., et al.; "Synthesis, Morphology and Field-Effect Mobility of Anthradithiophenes"; J. Am. Chem. Soc. 1998, 120; pp. 664-672.

Ponomarenko, Sergei A.; "Star-Shaped Oligothiophenes for Solution-Processible Organic Field-Effect Transistors"; Adv. Funct. Mater. 2003, 13, No. 8, Aug.; pp. 591-596.

Sun, Yanming; "Oligothiophene-Functionalized Truxene: Star-Shaped Compounds for organic Field-Effect Transistors"; Adv. Funct. Mater, 2005, 15, No. 5, May; pp. 818-822.

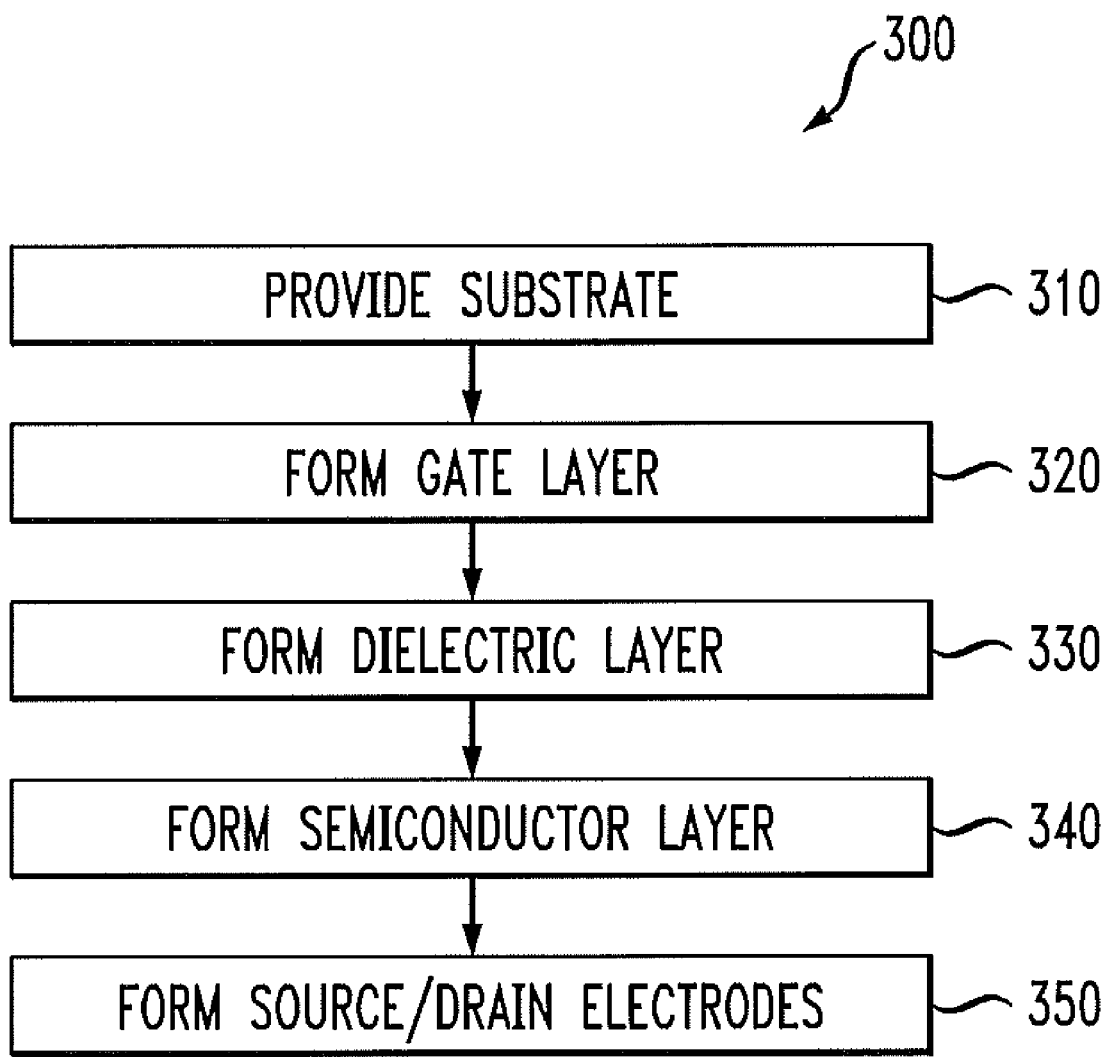

BRANCHED PHENYLENE-TERMINATED THIOPHENE OLIGOMERS

CROSS-REFERENCE TO RELATED APPLICATIONS

This Application is a Divisional of U.S. application Ser. No. 11/257,902 filed on Oct. 25, 2005, now U.S. Pat. No. 7,714,320 to Ashok J. Maliakal, et al., entitled "BRANCHED PHENYLENE-TERMINATED THIOPHENE OLIGOMERS," currently Allowed; commonly assigned with the present invention and incorporated herein by reference.

TECHNICAL FIELD OF THE INVENTION

The present invention is directed, in general, to a composition for use in electrical devices.

BACKGROUND OF THE INVENTION

Organic semiconductors are the subject of intense research because they have great potential in applications such as organic light-emitting diodes (OLEDs), organic field-effect transistors (OFETs), and other electronic devices. Organic semiconductors are predicted to provide a cheaper alternative to current technology, with high temperature processing and masking steps eliminated. In addition, organic semiconductors are amenable to printing and large area manufacturing, allowing the use of flexible plastic substrates.

Numerous improvements must be made, however, before organic semiconductors see widespread application in electronic devices. For example, the stability and reproducibility of devices having organic semiconductors fall short of that of amorphous silicon transistors. Additionally, many previously tried organic semiconductor materials have low charge-carrier mobility, or do not form a uniform continuous thin film.

SUMMARY OF THE INVENTION

To address one or more of the above-discussed deficiencies, one embodiment is a composition. The composition comprises a plurality of branched organic molecules. Each of the molecules has a core comprising at least one aromatic ring and at least three pendant arms chemically bonded to the core. The pendant arms comprise a phenylene-terminated thiophene oligomer.

Another embodiment is a device. The device comprises a layer composed of a plurality of the above-described branched organic molecules.

Yet another embodiment comprises a method of manufacture. The method comprises forming a layer on a substrate, the layer comprising a plurality the above-described branched organic molecules.

BRIEF DESCRIPTION OF THE DRAWINGS

Various embodiments are understood from the following detailed description, when read with the accompanying figures. Various features may not be drawn to scale and may be arbitrarily increased or reduced in size for clarity of discussion. Reference is now made to the following descriptions taken in conjunction with the accompanying drawings, in which:

FIG. 3 presents a flow diagram showing selected steps in an exemplary method of manufacture.

DETAILED DESCRIPTION

Figure 1:
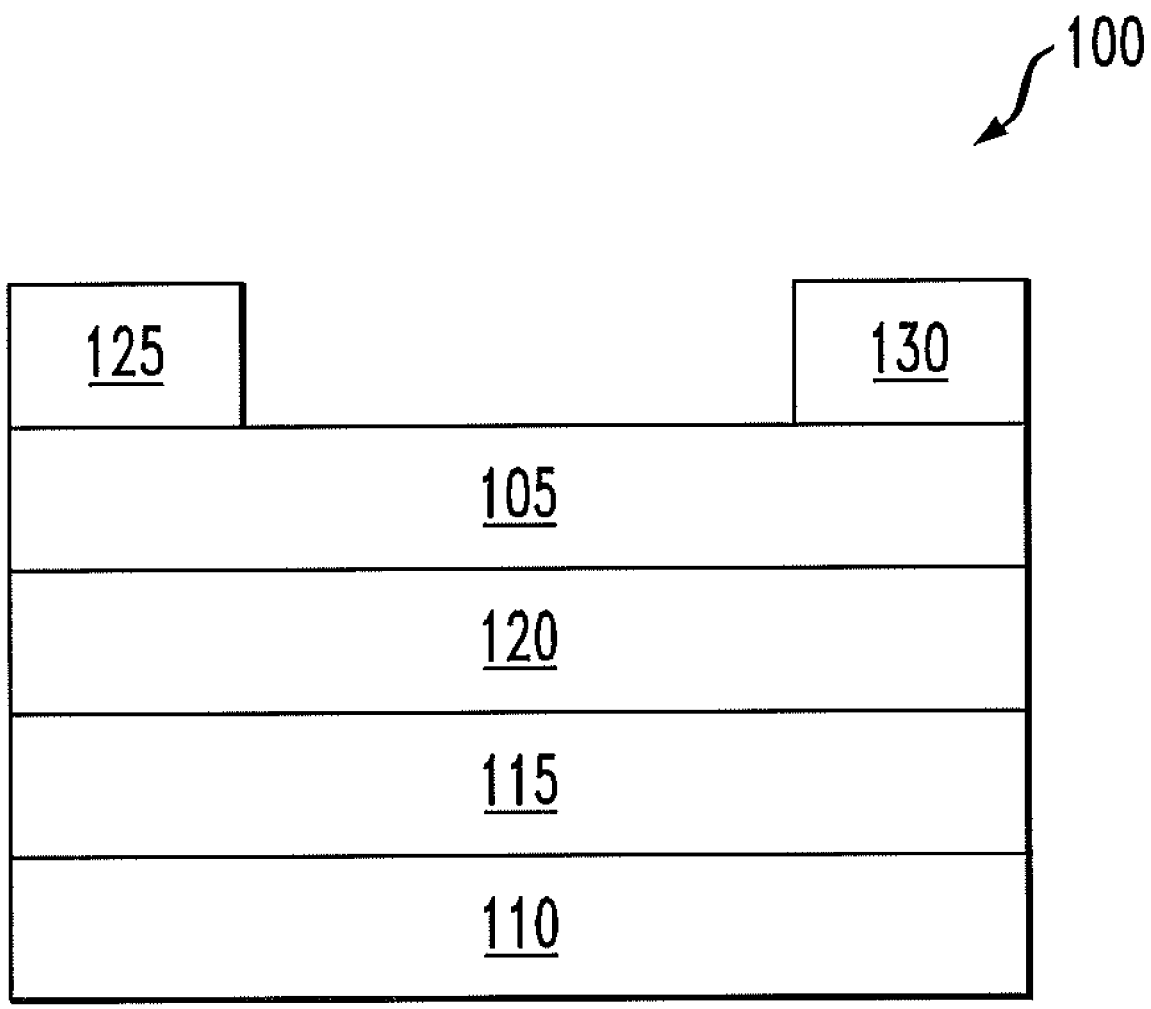
FIG. 1 presents cross-sectional view of an exemplary embodiment of a OFET device.

One embodiment is a composition. The composition comprises a plurality of branched organic molecules having a central core and at least three pendent arms. Each of the plurality of the molecules has the general formula:

$$C\text{-}(((A)(A'')\ldots(A^n)_n)) \qquad (1)$$

where C is the core comprising at least one aromatic ring, and A, A" ... A$^n$ are the n number of pendent arms that are covalently bonded to the core. Each pendent arm comprises a phenylene-terminated thiophene oligomer.

While not limiting the scope of the embodiment by theory, it is thought the phenylene termination of the pendant arms of the branched organic molecule is critical to obtaining compositions with the desired electrical and mechanical properties. It is thought that the phenylene termination promotes pi-stacking between adjacent branched molecules, thereby improving the mobility when the composition is formed into a semiconductive film.

Additionally, in some cases, it is thought that the phenylene termination promotes the formation of compositions having an amorphous layer, which is thought to enhance the mechanical stability and mobility of the layer. This is in contrast to the conventional wisdom that it is desirable to form crystalline structures when using such low molecular weight molecules (e.g., less than about 2000 gm/mol) to form a semiconductor layer in OFET devices.

The branched organic molecules can have a phenylene-terminated thiophene oligomer that comprises from 1 to 20 thiophene rings. In some cases, the phenylene-terminated thiophene oligomer comprises from 2 to 6 thiophene rings. In still other cases, the thiophene oligomer is an alpha oligothiophene such as 2,2'-bithiophene or 2,2':5',2":5",2"':5"',2"":5"",2""'-sexithiophene.

Embodiments of the branched organic molecules can have a core that is a single aromatic ring. For example, the aromatic ring can be a benzene ring or a triazine ring. In other embodiments the core comprises a fused ring system. The fused ring system can have at least one aromatic ring that is ortho-fused to at least two other rings of the fused ring system. For example, the fused ring system can be a truxene ring, where a central benzene ring is fused to three cyclopentane rings.

To facilitate packing between branched organic molecules it is desirable in some cases for the pendent arms to be covalently bonded to the core in a symmetrical fashion. For example, for molecules having three pendant arms, each of the pendant arms can be respectively bonded to the carbon arms of the benzene core at the 1, 3 and 5 positions. As another example, each of the pendant arms can be respectively bonded to the carbon atoms of a triazine core. As still another example, each of the pendant arms can be respectively bonded to the perimeter phenylene rings of a truxene core.

In some cases, one or more of the terminal phenylene groups are unsubstituted. Compositions comprising such molecules advantageously have p-type properties. One examples of such a molecule is 1,3,5-tri(5-Phenyl-[2,2'] bithiophenyl)benzene:

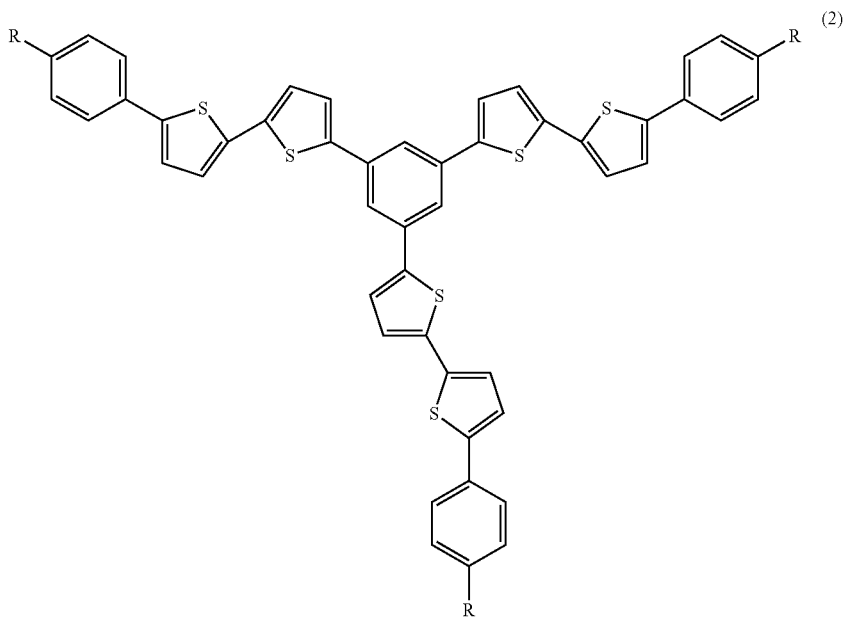

where R=H.

Another example is tri-(5-phenyl) [2,2']bi-thiophenyl truxene:

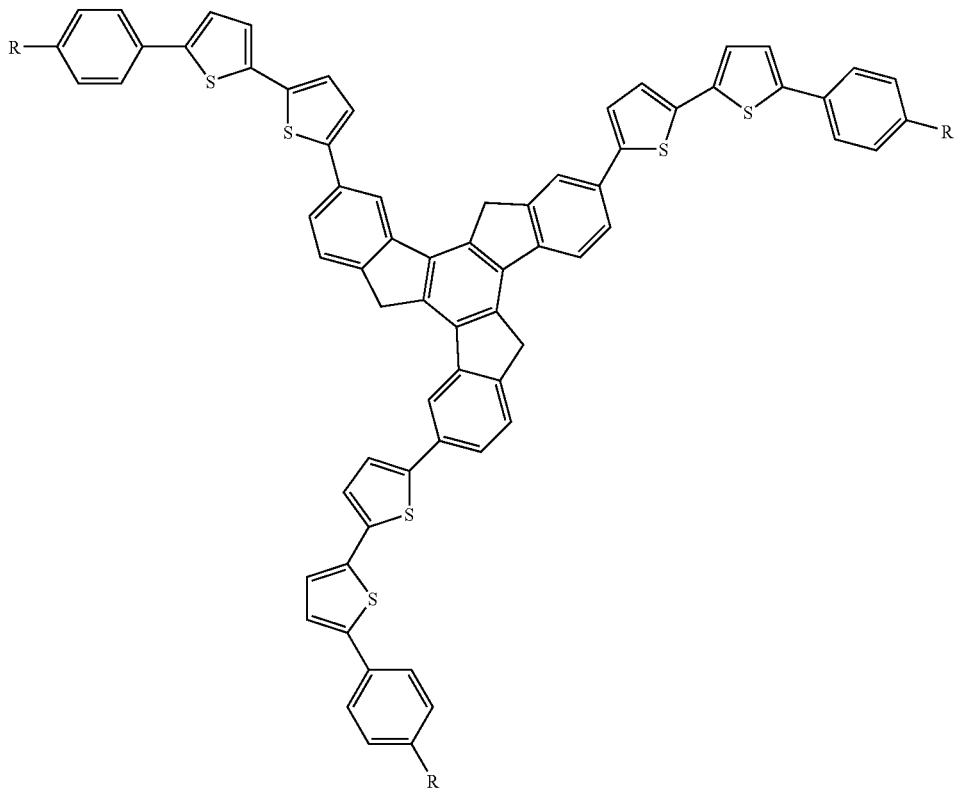

where R=H.

In other cases, however, it is advantageous to covalently bond a one or more substituent (R-group) to the terminal phenylene group of at least one pendant arm and, in some cases, all three pendent arms. The substituent can improve the packing of the branched organic molecules in the composition, for example, to form a more uniform continuous film. The substituent can also alter the electrical properties of the branched organic molecule or compositions formed therefrom, for example, to provide an n-type organic semiconductor.

In some preferred embodiments, the same R-group is attached to the terminal phenylene group of each pendant arm. In some cases it is preferable for the R group to be attached to the 4-position of the phenylene group because this arrangement enhances the effect of the substituent on the molecule's electrical properties. For example, a substituent in the 4-position has a greater interaction with the pi conjugation between the rings of the pendent arm. However the same or different R-groups can be alternatively or additionally attached to the 3 or 5 position, and 2 or 6 position of the phenylene group.

In some instances, one or more of the terminal phenylene groups are substituted with an alkyl group. Such substitutions are thought to improve the packing and cohesion between molecules in the film. The presence of alkyl groups can also advantageously improve the solubility of the molecules in solvents used to form layers of the composition via drop casting. Compositions comprising such molecules can also have p-type properties. Examples of suitable alkyl groups include branched or linear alkyl groups having up to 20 carbon atoms, and more preferably 6 to 10 carbon atoms. For example the R-group is an n-hexyl group. Examples of such molecules include 1,3,5-tri(5-{4-hexyl-Phenyl}-[2,2']bithiophenyl)benzene or tri(5-{4-hexyl-Phenyl}-[2,2']bithiophenyl)truxene, corresponding to formulas (2) and (3), respectively, where $R=CH_3—(—CH_2—)_5$.

In other instances, one or more of the terminal phenylene groups are substituted with a fluorocarbon group. Fluorocarbon substitution can advantageously impart n-type properties to the branched organic molecules and compositions comprising such molecules. The term fluorocarbon group as used herein refers to a hydrocarbon, in which least some of the hydrogen atoms bonded to the carbons atoms of a hydrocarbon have been replaced by fluorine atoms. The fluorocarbon group can be a perfluorocarbon group, where all of the hydrogen atoms have been replaced by fluorine. Suitable hydrocarbons include branched or linear alkyl groups having up to 20 carbon atoms, and more preferably 1 to 6 carbon atoms, where some or all of the hydrogen atoms bonded to the carbon atoms have been replaced by fluorine atoms. For example, the R-group can be a trifluoromethyl or a perfluoro-n-hexyl group. Examples of such molecules include 1,3,5-tri(5-{4-trifluoromethylphenyl}-[2,2']bithiophenyl)benzene or tri(5-{4-trifluoromethylphenyl}-[2,2']bithiophenyl)truxene, corresponding to formulas (2) and (3), respectively, where $R=CF_3$.

In some preferred embodiments, the branched organic molecules are star-shaped. The term star-shaped molecules as used herein refers to molecules whose pendant arms are substantially in the same plane as each other and the core, and hence are substantially two-dimensional molecules. Having the pendant arms in the same plane is thought to advantageously promote pi-stacking between adjacent molecules, which as noted above, can improve the mobility of the composition. The pendant arms are substantially in the same plane when each of the rings of a pendant arm form a dihedral angle of less than about 45 degrees with the other rings in that pendant arm, or with the core.

As noted above, at least some of branched organic molecules can form an amorphous composition. This can be advantageous when the molecules are used to form a semiconductor film in an OFET device, or a light-emitting layer of an OLED device. The term amorphous composition as used herein refers to a composition having no discernable peaks in the x-ray powder pattern. For example, there are no discernable peaks that can be attributed to an ordered structure over a range of diffraction angles 2θ ranging from 0 to 60 degrees.

Some of the molecules have a pi-pi conjugation length that comprises the rings of a pendant arm and the aromatic ring of the core. One of ordinary skill in the art would understand how to determine the conjugation length of the molecules based on their ultraviolet/visible and fluorescent spectroscopic properties. For example, some molecules having the above-described conjugation length have ultraviolet absorption and fluorescence emission peaks at about 390 and 500 nanometers, respectively.

One of ordinary skill in the art would be familiar with methods to synthesize and purify the above-described branched organic molecules. Exemplary synthetic reactions that could be adopted to synthesize these molecules are presented in: Ponomarenko, S. A. et al., Adv. Funct. Mater., 2003, 13(8), 591-96; Sun, Y. M. et al., Adv. Funct. Mater., 2005, 15(5), 818-22; and Pei, J. et al., J. Am. Chem. Soc. 2003, 125, 9944-45, all of which are incorporated by reference in their entirety.

As an example, presented below are some possible synthetic routes to produce molecules having a benzene core, such as molecules illustrated in formula (2). Such molecules can be synthesized by first forming a phenylene-terminated thiophene oligomer that corresponds to a pendant arm of the molecule.

The phenylene-terminated thiophene oligomer can be produced in a number of ways. For instance, an R-group-substituted 1-bromobenzene can be reacted with a di-borane compound (e.g., bispinacolatodiboron) under palladium catalyst conditions to form a R-group-substituted boronic ester. The R-group-substituted boronic ester is reacted with a bromo-thiophene oligomer in a Suzuki coupling to form the phenylene-terminated thiophene oligomer. Alternatively, a R-group-substituted phenyl boronic acid, if available, can be directly reacted with a bromo-thiophene oligomer in the Suzuki coupling to form the phenylene-terminated thiophene oligomer. As still another alternative, a Stille coupling can be performed to react an organo-tin thiophene compound (e.g., 2-tributylstannylthiophene) with a bromine substituted phenyl thiophene (e.g., 2-bromo-5-phenyl thiophene) to form the desired phenylene-terminated thiophene oligomer (e.g., phenylene-terminated bithiophene).

The phenylene-terminated thiophene oligomer can then be covalently bonded to the core to form the pendent arms of the molecule. For example, the phenylene-terminated thiophene oligomer can be coupled to a benzene core in a Stille coupling similar to that discussed above. The phenylene-terminated thiophene oligomer is reacted with an organo-tin compound (e.g., tributylstannyl chloride) to form a tributylstannyl-substituted phenylene-terminated thiophene oligomer that, in turn, is reacted with a bromine-substituted benzene (e.g., 1,3,5 tribromobenzene) to form the branched molecule.

Similar synthetic steps can be followed to produce branched organic molecules having a truxene core, such as the molecules illustrated in formula (3). For example, the phenylene-terminated thiophene oligomer can be formed by any of the above-described methods. The phenylene-terminated thiophene oligomer can then be reacted with a bromine-substituted indanone in a Suzuki coupling to form an phenylene-thiophene-thiophene-indanone. This compound can then be refluxed with titanium chloride and 1,2-dichlorobenzene to fuse the cyclopentane rings of the indanone group to a phenyl ring to form a truxene ring having phenylene-terminated thiophene oligomer pendant arms.

Another embodiment is a device. The device comprises a layer composed of a plurality of any of the above-described branched organic molecules. For example, each of the molecules have a core comprising at least one aromatic ring and at least three pendant arms covalently bonded to the core, the pendant arms comprising a phenylene-terminated thiophene oligomer.

FIG. 1 presents cross-sectional view of an exemplary embodiment of an OFET device 100. OFET device 100 can be used in any number of applications, such as biosensors, integrated circuits, displays, logic devices and memory devices. The OFET device 100 presented in FIG. 1 is a top contact bottom gate device. However, one of ordinary skill in the art would understand that the OFET device 100 could have other conventional configurations, such as a bottom contact OFET device or top gate OFET devices.

The OFET device 100 shown in FIG. 1 has a layer 105 comprising the plurality of branched organic molecules. In some preferred embodiments, the branched molecules form an amorphous layer 105 in the OFET 100. The layer 105 can be a p-type or n-type semiconductor layer. For example, when a p-type layer is desired, the molecules can comprise pendant arms with terminal phenylene groups that are either unsubstituted, or substituted with, for example, an alkyl group as discussed above. When an n-type semiconductor layer is desired, the molecules can comprise pendant arms with terminal phenylene groups that are substituted with a fluorocarbon group, as discussed above.

In some cases the layer 105 is a semiconductive film having a mobility in the saturation regime of least about $1\times10^{-2}$ $cm^2V^{-1}s^{-1}$. In other cases, layer 105 semiconductive film having a $I_{on}/I_{off}$ ratio of at least about $1\times10^3$ in the saturation regime.

The device 100 shown in FIG. 1 further includes a substrate 110, bottom gate 115, dielectric layer 120, and source and drain electrodes, 125, 130. All of these components can comprise any conventional material well known to those skilled in the art. For example the substrate 110 can be made of silicon or flexible organic materials such as plastics, for example poly Ethylene terephthalate (PET). The bottom gate 115 can comprise doped silicon. In other cases materials more conducive to forming a flexible device, such as indium tin oxide (ITO), can be used. Similarly, the gate dielectric can comprise silicon dioxide, or more flexible materials, such as polymer dielectrics like polybutyl methacrylate (PBMA). The source and drain electrodes 125, 130 can comprise gold or other electrically conductive metals or non-metals, such as electrically conductive polymers.

Figure 2:
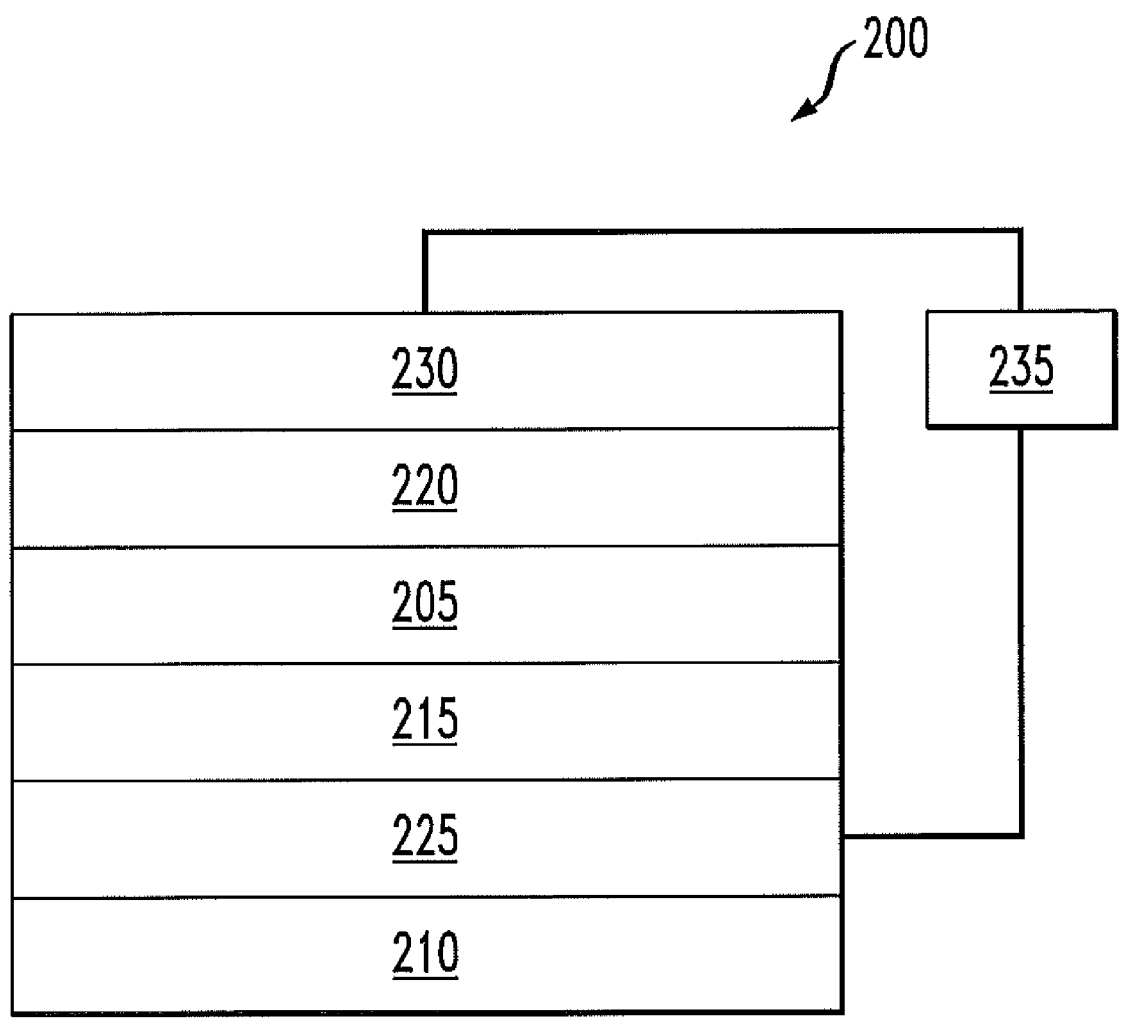
FIG. 2 presents cross-sectional view of an exemplary embodiment of a OLED device.

FIG. 2 presents cross-sectional view of an exemplary embodiment of an OLED device 200. The OLED device 200 shown in FIG. 2 has a light-emitting layer 205 comprising the plurality of branched organic molecules. In some preferred embodiments of the device 200, the light-emitting layer 205 comprises molecules than form an amorphous layer.

The OLED 200 device as illustrated in FIG. 2 can further include a number of conventional components such as a substrate 210, hole injection layer 215, electron transport layer 220, and cathode and anode 225, 230 electrically connected to a voltage source 235. These components can comprise any conventional material well known to those skilled in the art. For example, the substrate 210 can comprise glass, the hole injection layer 215 can comprise polyethylenethioxythiophene: polystyrene sulfonic acid, the electron transport layer 220 can comprise tris~8-hydroxyquinoline aluminum and the cathode and anode 220, 225 can comprise conductive materials, such as aluminum or ITO.

Another embodiment is a method of manufacture. The method of manufacture can be use to fabricate any of the above-described compositions or devices. FIG. 3 presents a flow diagram showing selected steps in an exemplary method of manufacturing a device.

A substrate is provided in step 310. The substrate can include any conventional material, including the materials discussed above in the context of FIGS. 1-2. The substrate can also include device component layers such as bottom gate 115, dielectric layer 120 in the case of OFET devices such as illustrated in FIG. 1, or hole injection layer 215 and cathode 225 in the case of OLED as illustrated in FIG. 2. For example, in some embodiments of the method, the substrate comprises glass upon which are successively formed, in step 320, a gate electrode comprising physical vapor deposited ITO, and an insulating layer, in step 330, comprising spin-coated PBMA. Alternatively, the substrate can comprise a silicon layer implanted with n- or p-type dopants, followed by a thermally grown $SiO_2$ dielectric layer, in steps 320 and 330, respectively.

In step 340, the layer of branched organic molecules is formed on the substrate. The layer can be a thin film semiconductor in OFET devices or a light-emitting layer in OLED devices. The molecules can comprise any of the above-described embodiments of branched molecules having a core comprising at least one aromatic ring and at least three pendant arms covalently bonded to the core, the pendant arms comprise a phenylene-terminated thiophene oligomer. Layers comprising branched molecules that form amorphous layers are thought to advantageously improve the thin-film forming properties of the layer.

In some instances, the layer is formed in step 340 by evaporating the molecules to deposit the molecules onto the substrate. Preferred evaporating conditions include pressures of about $1\times10^{-5}$ Torr or less. It can be advantageous to hold the substrate at certain fixed temperatures during the evaporation. For example, layers comprising 1,3,5-tri(5-Phenyl-[2,2']bithiophenyl)benzene that are deposited at about 60° C. have higher mobility than layers of the same composition deposited at other temperatures. layers comprising 1,3,5-tri (5-{4-hexyl-Phenyl}[2,2']bithiophenyl)benzene or 1,3,5-tri (5-{4-trifluoromethylphenyl}[2,2']bithiophenyl)benzene that are deposited at about 25° C. have higher mobility than films of the same composition deposited at other temperatures. The some cases, layers formed via evaporation have a thickness ranging from about 50 to about 100 nanometers.

In other instances, the layer is formed in step 340 by drop casting the molecules on the substrate. Solutions of the molecules for drop casting can be prepared by dissolving the molecules in organic solvents at above room temperature. In some cases the concentration of molecules in the solution is about 400 ppm and drop casting is done with the solution and substrate held at 100° C. The choice of organic solvent can advantageously improve the mobility of the drop cast films. For example solutions of 1,3,5-tri(5-Phenyl-[2,2']bithiophenyl)benzene in chlorobenzene yielded layers of higher mobility than the same compound dissolved in other organic solvents. Solutions of 1,3,5-tri(5-{4-hexyl-Phenyl}[2,2'] bithiophenyl)benzene in m-xylene yielded layers of higher mobility than the same compound dissolved in other organic solvents.

In step 350, source and drain electrodes are formed on the layer using conventional procedures. In some cases, for example, gold source and drain electrodes are deposited on the layer using a shadow mask. Of course, alternative steps would be followed to deposit the anode and hole injection layers to form an OLED device such as illustrated in FIG. 2.

Also, further steps, well-known to those skilled in the art, could be performed to form an operative device.

Although the embodiments have been described in detail, those of ordinary skill in the art should understand that they could make various changes, substitutions and alterations herein without departing from the scope of the invention.

What is claimed is:

1. A method of manufacture, comprising, forming a layer on a substrate, said layer comprising a plurality of branched organic molecules, each of said molecules having a core and three pendant arms covalently bonded to said core, wherein said core is an aromatic ring or a fused aromatic ring system, said pendant arms comprise a phenylene-terminated thiophene oligomer, a pi-pi conjugation portion of said branched organic molecules includes said terminal phenylene groups of said three pendant arms and said core, and said branched organic molecule has a molecular weight of less than about 2000 gm/mol.

2. The method of claim 1, wherein forming said layer comprises evaporating said branched organic molecules to deposit said molecules onto said substrate.

3. The method of claim 1, wherein forming said layer comprises drop casting said branched organic molecules on said substrate.

4. The method of claim 1, wherein said layer is a semiconductive film in an OFET device.

5. The method of claim 1, wherein said layer is a light-emitting layer of an OLED device.

* * * * *